United States Patent [19]

Williamson et al.

[11] Patent Number: 5,053,696

[45] Date of Patent: Oct. 1, 1991

[54] ELECTRO-ELECTRON OSCILLOSCOPE

[75] Inventors: Steven L. Williamson, Henrietta; Gerard A. Mourou, Rochester, both of N.Y.

[73] Assignee: The University of Rochester, Rochester, N.Y.

[21] Appl. No.: 147,098

[22] Filed: Jan. 20, 1988

Related U.S. Application Data

[63] Continuation of Ser. No. 709,751, Mar. 8, 1985, abandoned.

[51] Int. Cl.⁵ .................... G01R 19/00; G01R 23/16; G01R 31/00
[52] U.S. Cl. ........................ 324/121 R; 324/77 K; 324/96; 324/158 R
[58] Field of Search ................ 324/121 R, 158 R, 96, 324/95, 77 K

[56] References Cited

U.S. PATENT DOCUMENTS

| | | |
|---|---|---|
| 3,761,614 | 9/1973 | Bradley . |
| 4,319,186 | 3/1982 | Kingsley ............................. 324/96 |
| 4,446,425 | 5/1984 | Valdmanis . |
| 4,463,253 | 7/1984 | Lucht . |

FOREIGN PATENT DOCUMENTS 2068137 8/1981 United Kingdom .

OTHER PUBLICATIONS

Moritani, Appl. Opt., 22, 9, 1329, May 1, 1983.
Casasent, Appl. Opt., 18, 14, 2445, Jul. 15, 1979.
Alferness, Appl. Phys. Lett., 37(7) 597, Oct. 1, 1980.
Izutsu, IEEE J. Quant. Elect. QE-14, 6, 394, Jun. 1978.
Tsuchiya, SPIE, 348, 245 (1982).
Tsuchiya, IEEE J. Quant. Elect., QE-20, 12, 1516, Dec. 1984.
Sibbet, SPIE, 348, 15 (1982).
Valdmanis, IEEE J. Quant. Elect., QE-19, 4, 664, Apr. 1983.
Mourou, Appl. Phys. Lett. 45(5), 492, Sep. 1, 1984.
Kaminow, Appl. Phys. Lett., 22, 540 (1973).
White, Opt. Comm., 5, 374 (1972).
Auth, IEEE J. Quant. Elect., QE-5, 12, 223, Dec. 1969.
Kobayashi et al.; Electronics Letters; vol. 18, No. 5; Mar, 4, 1982; pp. 210-211.

Primary Examiner—Ernest F. Karlsen
Attorney, Agent, or Firm—Martin Lukacher

[57] ABSTRACT

A system for time-resolving ultra-short electrical waveforms of up to a few hundred gigahertz bandwidth is presented. The system utilizes a fast electro-optic modulator capable of subpicosecond responsivity. A CW (continuous wave) laser is used to probe the change in birefringence resulting in the modulator due to an induced electric field. The rapid change in the transmitted optical signal due to an equally rapid changing electric field (picosecond pulse) is then detected and temporally dispersed using a picosecond resolution streak camera. The modulator operates in a region close to minimum transmission where the average optical power is below the damage threshold for the photocathode of the streak camera and where small electrical signals can significantly modulate the transmitted beam. The system can be used in either sampling mode where the modulation and subsequent detection are repeated and the data accumulated at repetition rates as high as 100 MHz or in single shot mode.

18 Claims, 4 Drawing Sheets

ELECTRO-ELECTRON OSCILLOSCOPE

This is a continuation of application Ser. No. 709,751, filed Mar. 8, 1985, now abandoned.

DESCRIPTION

The present invention relates to systems which time-resolve and display electrical signals possessing broad bandwidth, and particularly to a system ulitizing both electro-optical and electron-optical means to measure the temporal waveform of an electrical signal by first converting the signal to an optical replica and then to an electron replica, where the temporal profile can then be streaked along an electroluminescent screen. A system provided in accordance with the invention can be capable of displaying signals of bandwidths in the few hundred gigahertz range.

The invention makes it possible to incorporate an electron-device, such as the streak camera, which is capable of subpicosecond resolution, to indirectly characterize an electrical signal with picosecond resolution. The electrical signals to be interrogated can be of millivolt amplitude and of few hundred gigahertz bandwidth. The invention utilizes electro-optic means for converting the original electrical signal into an optical replica which is translated into an electron beam replica which can be temporally dispersed using the streak camera. The conventional use of the streak camera is in the characterization of very short optical pulses. This is possible because of the ability of the streak camera to maintain the temporal integrity of the optical pulse in the form of an electron replica as the electrons are being rapidly streaked (deflected) across the phosphor screen. Such streak cameras are discussed in U.S. Pat. Nos. 3,761,614 issued Sept. 25, 1973 and 4,463,253 issued July 31, 1984, as well as in articles appearing in SPIE Vol. 348 High Speed Photography (San Diego, 1982), pages 15-26 and 245-250.

Application of an electro-optical modulator to convert an electrical waveform to an optical waveform so that the temporal information can be dispersed (displayed in space along the phosphor screen) with the aid of the streak camera, has not heretofore been accomplished. It has been discovered in accordance with the present invention that an electrical signal, even with very low amplitude, can be electro-optically characterized, in the sampling mode of operation by optically biasing the modulator assembly close to the minimum transmission point where the maximum ratio of (modulated signal)/(baseline signal) referred to hereinafter as the optical efficiency is achieved. With the arrangement, very low average laser power (on the order of nanowatts) is directed onto the sensitive photocathode of the streak camera thus eliminating the possibility of damage.

Heretofore, electrical signals have been sampled utilizing a Pockels cell in an impedance matched geometry to obtain fast electro-optic modulation. A comb of short laser pulses was then used to sample the induced birefringence which results as the electrical signal travels across the crystal. Slow optical detectors could then be incorporated to detect the change in amplitude of the short laser pulses. In the invention now described the converse of this previous technique is performed; instead of ultra-short laser pulses and slow response detectors, the present invention relies on a stable CW laser source and an ultra-fast detector. A system for picosecond electro-optic sampling utilizing ultra-short laser pulses is described in U.S. Pat. No. 4,446,425 issued May 1, 1984 to J. Valdmanis and G. Mourou. The system is further described in the Applied Physics Letters 41, 211 (1982) and in the IEEE Journal of Quantum Electronics, Vol. QE-19, No. 4, pages 664-667 (April, 1983).

It is the principal object of the present invention to provide an improved system for performing time-measurement of picosecond electrical waveforms or any electrical transient possessing frequency components up to a few hundred gigahertz.

It is a still further object of the present invention to provide an improved system for measuring ultra-short electrical signals where the signal amplitude may only be of the order of millivolts.

It is still a further object of the present invention to provide an improved system for measurement of ultra-short electrical waveforms utilizing both electro-optic and electron-optical means so as to benefit from the broad bandwidth capability of the electron-optical means, which may be a streak camera detection system.

Briefly described, a system for displaying an image of an electrical signal in accordance with the invention provides temporal resolution in the single picosecond range. The system utilizes a source providing a continuous optical signal, such as a CW laser beam to provide continuous and, more importantly, ultra-stable probing of the change in birefringence of an electro-optic modulator which is produced in response to the electrical signal. The modulated optical signal is then applied to electron-optical means, such as a streak camera, where the modulation along the z-axis (i.e. time axis) is preserved in the form of an electron waveform which upon entering a rapidly time-varying electric field will be transformed into an intensity variation along the x-axis of an electroluminescent screen to display the image (replica) of the signal. The scintillation at the screen, which depicts the signal replica can be detected either by using a linear array of detectors in a single shot mode of operation, or by using a single detector in a sampling mode of operation. The modulated optical signal incident on the electron-optical means is limited in a manner to maximize system sensitivity. In particular, the streak camera is operated far below its space charge limited peak current and safely below its average current damage threshold.

The foregoing and other objects, features and advantages of the invention as well as a presently preferred embodiment thereof will become more apparent from reading of the following description in connection with the accompanying drawings in which.

Figure 1:
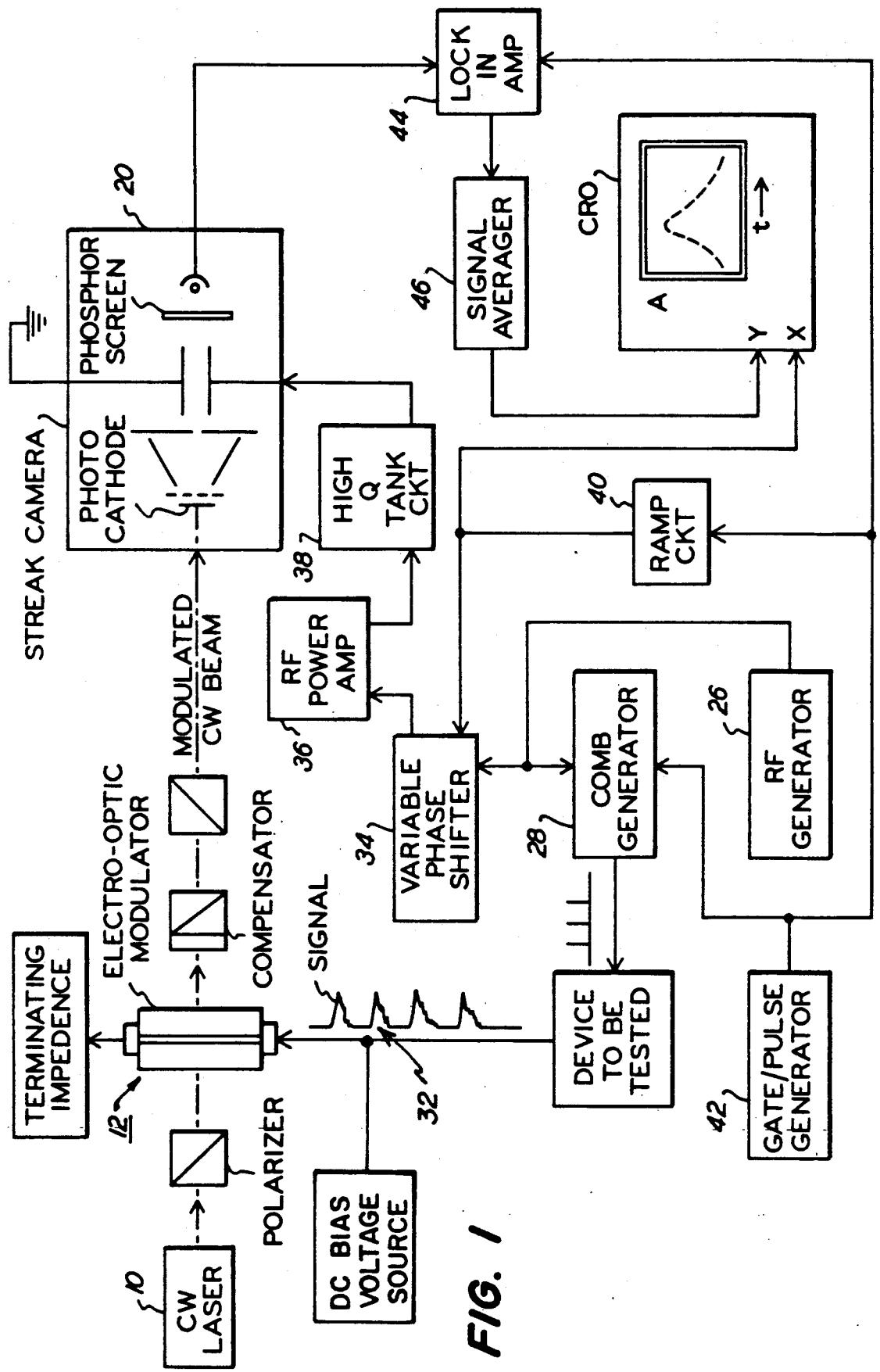
FIG. 1 is a block diagram, schematically showing an electro-electron optical system for time-resolving and displaying electrical signals with picosecond resolution in accordance with a presently preferred embodiment of the invention.

Referring more particularly to FIG. 1, there is shown a CW (continuous wave) laser 10 which produces a constant optical signal. This signal is preferably focused by lenses (not shown) so that the confocal region of the beam is within the bulk (the substrate) of an electro-optic modulator cell 12. The beam and the location of its confocal region in the substrate of the modulator cell 12 will be more apparent from FIGS. 3A through 3D where the beam is indicated at 16 and its confocal region at 18 within the bulk of the electro-optic birefringent material constituting the modulator cell 12, the cell being a traveling wave Pockels cell. The optical signal source provided by the laser 10 is preferably a single mode-type laser (single mode both longitudinally and transversely with respect to the path of the beam). The wavelength of the optical signal and hence, the type of laser used, is dependent upon the sensitivity of the photocathode in the electron-optical device of the system, which is preferably a streak camera 20. Suitably, single mode helium-neon or semiconductor lasers may be used as the CW laser 10, with the photocathode being of the S-20 type.

Figure 3A:
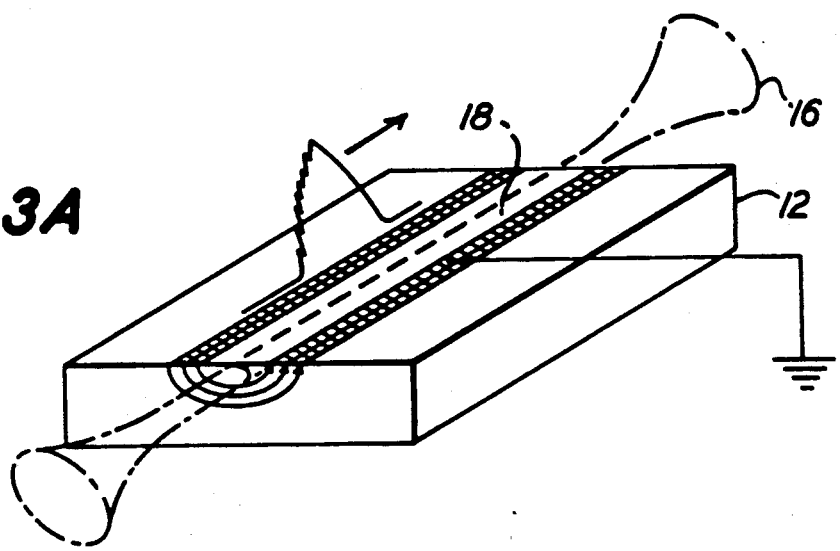
FIGS. 3A, B, C and D are perspective views, diagrammatically showing different types of bulk electro-optic modulators which may be used in the system shown FIG. 1.
Figure 3B:
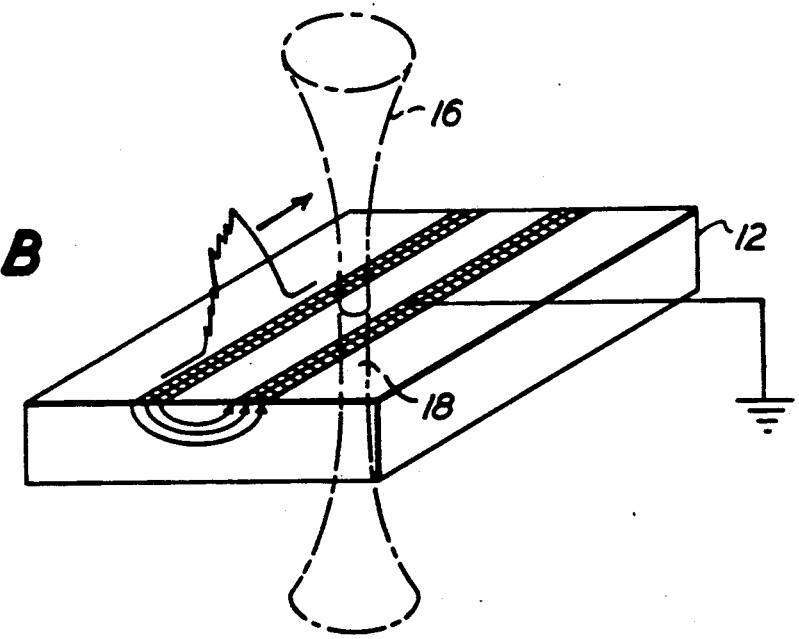
Figure 3C:
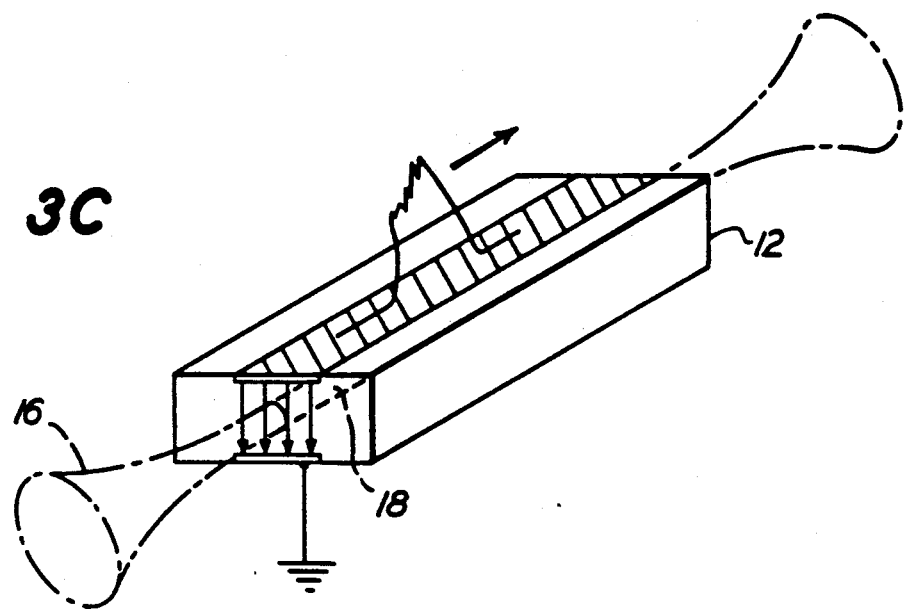
Figure 3D:
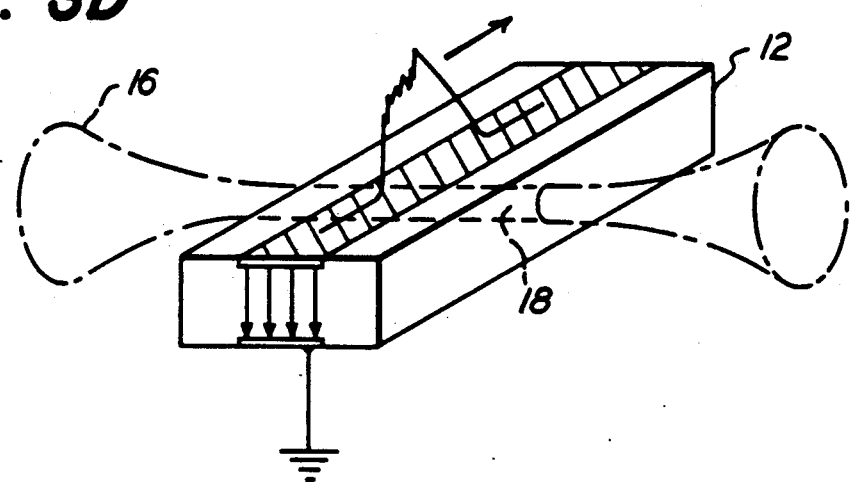

The electro-optic modulator cell is preferably a bulk-type fast modulator utilizing a substrate of birefringent material such as lithium niobate or lithium tantalate, though electro-optic materials such as cadmium sulfide or galium arsenide can also be used. The electrodes may be of coplanar-type striplines as shown in FIGS. 3A and 3B or on opposite sides of the crystal as shown in FIGS. 3C and 3D. The laser beam may be focused within the substrate so that it propagates along the length of the electrodes as shown in FIGS. 3A and 3C or it passes between the electrodes either through the thickness or width of the crystal as shown in FIGS. 3B and 3D, respectively. Further information concerning cells having coplanar electrodes may be found in U.S. patent application Ser. No. 593,992 filed Mar. 27, 1984 in the name of Girard Mourou and Kevin Meyer now U.S. Pat. No. 4,603,293, issued July 29, 1986. Additionally, electrical waveforms can be measured in a contactless arrangement as described in this application.

The modulator can support a few hundred GHz bandwidth. Signals are applied at the input of the modulator either with a connector which is mounted to one end of the electrodes, by wire bonding the source to the electrodes or in contactless mode through E-field radiation into free space. A traveling wave of the signal, which is schematically shown in FIGS. 3A through 3D, travels between the input and output ends of the transmission lines and creates an electric field (E-field) which affects the birefringence of the substrate material. While not presently preferred, wave guide modulators may be used as the electro-optic modulator. Further information with respect to wave guide modulators may be obtained from the article by I. P. Kaminow, et al., entitled Thin-Film LiNbO3 Electro-Optic Light Modulator, which appeared in Applied Physics Letters, Vol. 22, pages 540–542 (1973).

Further information respecting the use of coplanar strip transmission lines will be found in G. A. Mourou and K. E. Meyer, Subpicosecond Electro-Optic Sampling Using Coplanar Strip Transmission Lines, Applied Physics Letters, Vol. 45 (5), pages 492–494 (1984). Further information with respect to traveling wave electro-optic modulators may be obtained from the following articles: G. White and G. M. Chin, Traveling Wave Electro Optic Modulators, Optical Communication, Vol. 5, pages 374–379 (1972); IEEE Journal of Quantum Electronics, Vol. QE-5, No. 12, pages 223–224 (1969); IEEE Journal of Quantum Electronics, Vol. QE-14, No. 6, pages 394–395 (1978); and Applied Physics Letters, Vol. 37, No. 7, pages 597–598 (1980).

In addition to the modulator cell, the modulated CW beam is produced through the use of a polarizer and an analyzer on opposite sides of the cell 12 in the beam path. In accordance with a feature of this invention, the modulating means is operative to increase the change in transmission of the optical signal beam with respect to the beam transmission through the modulator assembly. The light incident on the photocathode of the streak camera is reduced so that the photocathode operates well below saturation, and safely below its damage threshold. However, this is not done at the expense of reduced signal-to-noise ratio of the modulated optical signal. The streak camera is sensitive to small signal variations in the CW carrier (laser beam). In effect the optical efficiency of the modulator is maximized and the overall sensitivity of the system is increased. This increase in efficiency is quite surprising in that it is done by minimizing the transmission through the modulator assembly rather than operating at 50% transmission.

In a preferred embodiment of the invention, the modulator is adjusted between crossed polarizers for minimum transmission in the absence of electrical signal which is applied to the traveling wave modulator cell 12. An optical compensator which can be installed between the cell and the analyzer allows adjustment of the transmission of the optical beam. The maximum transmission is on the order of $10^{-4} - 10^{-3}$ of the incident beam (see FIG. 2).

As can be seen from the efficiency curve (FIG. 2), the modulation efficiency (the ratio of the change of transmission to the transmission through the modulator assembly) increases rapidly for decreasing transmission. It is this change in transmission which produces the modulation of the beam. Since the streak camera is sensitive to the modulation, the overall sensitivity of the system is enhanced while the bandwidth handling capability of the system is maintained (up to a few hundred gigahertz).

Consider that in a modulator where the modulation is a function of polarization introduced by the variable birefringences of the modulator cell the transmission (through a set of crossed polarizers--the polarizer and analyzer having the traveling wave Pockels cell there between) is given by the following equation:

$$T = \sin^2\left[\left(\frac{\pi}{2}\right)\frac{V}{V_\pi}\right] \quad (1)$$

The sensitivity of modulation may be obtained by differentiating equation (1):

The efficiency, dT/dV can then be described as $$\frac{dT/dV}{T} = \frac{\pi}{V_\pi} \cot\left[\left(\frac{\pi}{2}\right)\frac{V}{V_\pi}\right] \quad (2)$$

Figure 2:
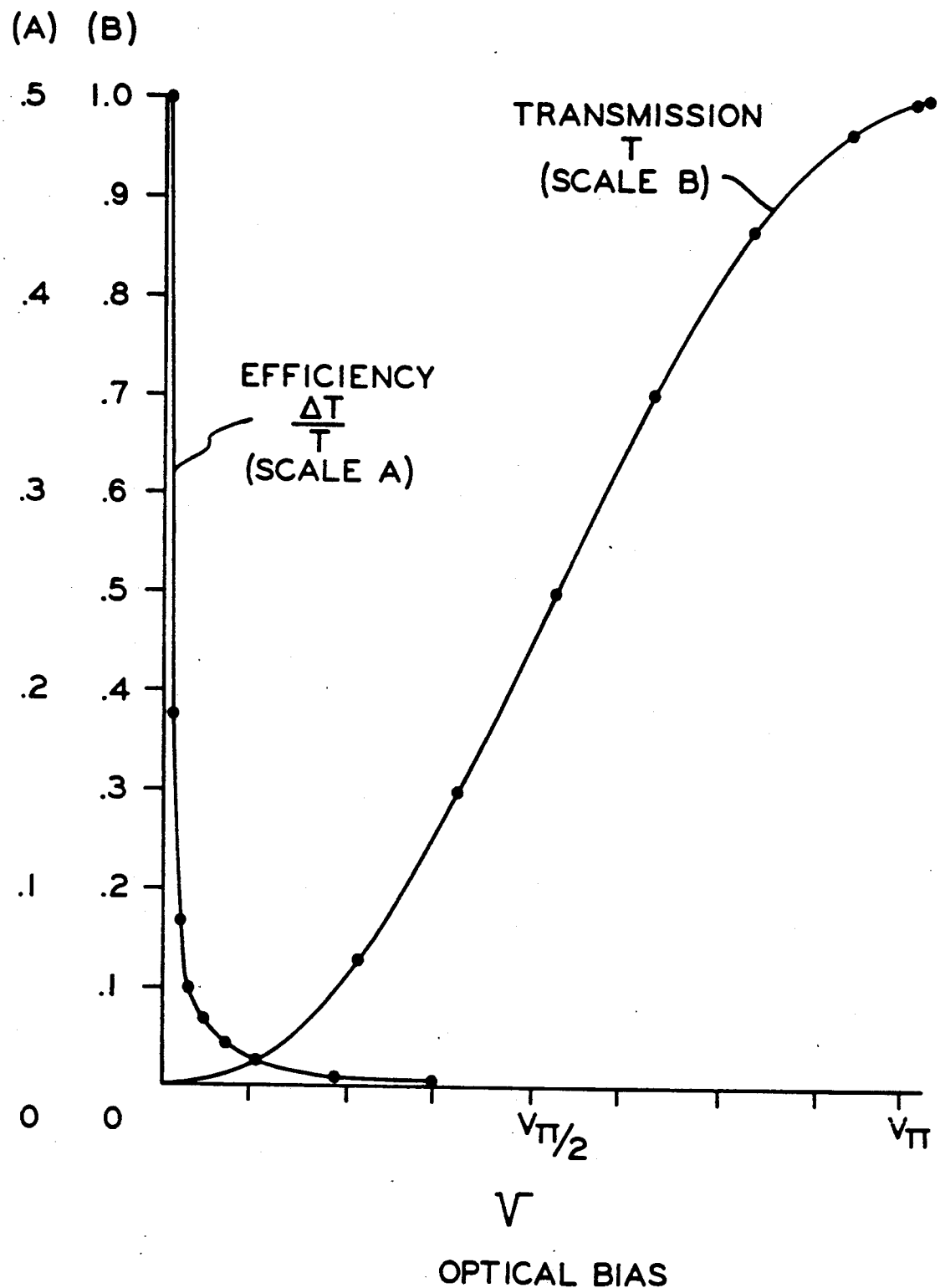
FIG. 2 is a graph depicting the properties of electro-optic modulators including those that are useful in the system shown in FIG. 1.

In the foregoing equations, V is the signal voltage of the traveling wave and $V_\pi$ is the half-wave voltage of the modulator cell which is used, i.e. that is the voltage required for 100% transission or at the 1.0 point on the transmission curve shown in FIG. 2. When operating at low transmission (small signal) the efficiency increases greatly (as the argument of the Cot factor approaches zero), thereby demonstrating that the modulated signal/carrier signal increases dramatically, thus explaining the surprising sensitivity of the system.

In order to adjust the amount of retardance so as to achieve the best combination of sensitivity and linearity for the signal amplitude of interest, a DC bias voltage may be applied to the electrodes of the modulator cell so as to interpose the requisite phase shift or retardance in the cell itself. It is, however, presently preferred to use the compensator as shown in FIG. 1.

In addition to the photocathode, the streak camera, which may be of conventional design, includes a phosphor screen and deflection plates which may be contained in an evacuated envelope or tube. Approximately centered at the center of the screen is a photo detector, such as a photo-multiplier tube or a semi-conductor detector, the output of which is amplified. This detector may be within, but is preferably outside, the envelope of the streak camera 20. The streak camera is preferably operated in the so-called synchroscan mode. More information with respect to such mode of operation may be obtained from the articles in SPIE Vol. 348, referenced above. The system may also be operated in a single-shot mode, preferably using a linear array of detectors after the phosphor screen to permit each waveform to be recorded in its entirety. This arrangement will reduce sampling times by up to a factor of 1000.

An RF Generator 26 provides a drive signal suitably matched to the resonant frequency of the synchroscan. This signal is applied to a comb generator 28 which produces a train of pulses at the selected frequency. The electrical signals are repetitively applied to the device under test which in turn repetitively produces the electrical waveform being sampled in the modulator 12. These electrical signals may, for example, result from turning on a device, the performance of which is to be characterized thereby deriving output signals which are to be displayed each time an enabling pulse is applied thereto. The device to be tested may be a circuit or a complete system which produces the signals at the rate of the enabling pulses from the comb generator 28. Accordingly, a train of these signals shown at 32 is applied to the modulator cell. Each signal produces the modulation of the CW laser beam corresponding thereto.

In the streak camera, the photocathode converts the modulated optical signal into an electron beam which is accelerated past deflection plates. The electron beam is scanned across the screen in synchronism with the signals which are applied to the electro-optic modulator but phase shifted with a variable phase shift very slightly upon each repetition of the signal. A variable phase shifter 34 provides this phase shift. The phase shifted signals are amplified in an RF power amplifier 36 which has a tank circuit 38 with high Q (for example about 150). An AC voltage which swings over a 10,000 volt range produces the deflection of the beam. The center of the scan is linear. The screen produces a replica of the electrical signal, since the modulated beam, (Z) modulated, is temporally dispersed across the screen during each scan. Without a variable phase shifter the scans will be repetitively placed at the same position on the screen and the screen may be photographed or a plurality of dissected outputs can be obtained representing the replica using a multi-channel analyzer (a so-called optical multi-channel analyzer of the type which is commercially available). It is, however, preferable to operate in a sampling mode utilizing the variable phase shifter 34 where each scan is time displaced very slightly with respect to the electrical signal. Then the photo detector provides outputs, in effect samples, of successive adjacent parts of the signal waveform.

In order to produce the variable scan, a ramp circuit 40 which produces a slowly increasing ramp, say from 10,000 pulses of a 1 KHz pulse train from a gate pulse generator 42. Accordingly, at least 10,000 samples and 10,000 scans are produced, each having an output from an adjacent portion of the waveform, the replica of which appears on the screen for each scan.

In order to improve the signal-to-noise ratio of the system, gate pulse generator 42 may enable the comb generator at a 1 KHz rate. On each enablement, a burst of 100 megahertz pulses is provided which in turn produces a burst of signals which are repetitively applied to the modulator cell 12. A lock-in amplifier 44, which operates at the gate pulse frequency (1 KHz) amplifies only these bursts and produces a sequence of outputs for each burst which is averaged in a signal amplifier 46. Thus for each burst, there is an output corresponding to the average of the amplitude of the outputs obtained during each burst. This average output is applied to the Y or vertical deflection input of a X-Y display, suitably a cathode ray oscilloscope (CRO). The time base of the oscilloscope (the X axis input) is obtained from the ramp circuit 40. Accordingly, the waveform of the electrical signal is traced as a series of dots which define the waveform of the screen of the oscilloscope. The waveform is enlarged because the time base is on a much expanded scale. Accordingly, the electrical signal is displayed with high resolution extending into the picosecond and subpicosecond range.

From the foregoing description it will be apparent that there has been provided an improved system for displaying very fast and very broad bandwidth electrical signals. A preferred embodiment of the electro-electron optical system whereby the display may be provided has been disclosed above. Variations and modifications in this system, within the scope of the invention, will undoubtedly suggest themselves to those skilled in the art. Accordingly, the foregoing description should be taken as illustrative and not in a limiting sense.

We claim:

1. A system for displaying a replica of an electrical signal with temporal resolution in the picosecond and subpicosecond range which comprises a source for providing a continuous optical signal, an electro-optic modulator having subpicosecond responsivity for modulating the optical signal from said source in accordance with said electrical signal, and electron-optical means having at least picosecond resolution for translating said modulated optical signal into a visible replica of said electrical signal.

2. A system for displaying a replica of an electrical signal with temporal resolution in the picosecond and subpicosecond range which comprises a source for providing a continuous optical signal, an electro-optic modulator for modulating the optical signal from said source in accordance with said electrical signal, electron-optical means for translating said modulated signal into a visible replica of said electrical signal, means for increasing the ratio of the change in transmission of said optical signal to the transmission of said optical signal through said modulator while reducing the intensity of said optical signal incident upon said electron-optical means whereby to increase the sensitivity of said system to said electrical signal.

3. The system according to claim 1 further comprising means for repetitively applying said signal to said electro-optic modulator, and wherein said electron-optical means includes means for producing an electron beam which is modulated in intensity in response to said modulated optical signal, and means for scanning said beam across an electron-optical detector in synchronism with the repetitive application of said electrical signal to said modulator.

4. The system according to claim 3 wherein said electron-optical detector is provided by means for producing said replica.

5. The system according to claim 1 further comprising means for biasing said electro-optic modulator for insubstantial transmission of said optical signal in the absence of said electrical signal.

6. The system according to claim 6 wherein said biasing means includes means for phase shifting said optical signal to provide less than a quarter wavelength of phase shift at the wavelength of said optical signal from said source.

7. The system according to claim 6 wherein said biasing means is operative to produce less than about one-eighth length phase shift at said source wavelength.

8. The system according to claim 2 wherein said electro-optic modulator includes a cell presenting a variable birefringence in accordance with said electrical signal, polarizer and analyzer means on opposite sides of said cell, and means for changing the polarization of said optical signal such that the transmission thereof through said analyzer in the absence of said electrical signal is minimized.

9. The system according to claim 8 wherein said polarization changing means is provided by means for interposing an optical bias between said polarizer and analyzer which provides said minimized transmission.

10. The system according to claim 9 wherein said means for interposing said optical bias is a compensator between said cell and said analyzer.

11. The system according to claim 1 wherein said modulator includes a cell of electro-optic birefringent material having means for supporting a traveling wave of said electrical signal.

12. The system according to claim 11 wherein said traveling wave cell includes a substrate of said electro-optic birefringent material having transmission lines thereon, and means for locating a beam of said optical signal in said substrate adjacent to said lines.

13. The system according to claim 12 wherein said modulator comprises polarizer and analyzer means in the path of said beam and disposed on opposite sides of said cell.

14. A system for displaying a replica of an electrical signal with temporal resolution in the picosecond and subpicosecond range which comprises a source for providing a continuous optical signal, an electro-optic modulator for modulating the optical signal from said source in accordance with said electrical signal, electron-optical means for translating said modulated signal into a visible replica of said electrical signal, said source being a CW laser, said modulator including a cell of electro-optic birefringent material having means for supporting a travelling wave of said electrical signal, said cell including a substrate of said electro-optic birefringent material having a transmission line thereon, means for locating a beam of said optical signal in said substrate adjacent to said line, said modulator further including polarizer and analyzer means in the path of said beam and disposed on opposite sides of said cell, and means for optically biasing said beam so that in the absence of said electrical signal the intensity of said beam transmitted through said polarizer, cell and analyzer is minimized.

15. The system according to claim 1 wherein said electron-optical means includes a streak camera having a photocathode on which said modulated optical signal is incident and which provides an electron beam.

16. The system according to claim 15 wherein said streak camera has a screen on which said electron beam is incident and further including synchroscan means for scanning said electron beam on said screen to provide a replica of said electrical signal.

17. The system according to claim 16 wherein said synchroscan means comprises means for applying said electrical signal repetitively to said modulator means at a given rate, means for providing a variable delay between the scanning of said beam and the application of said electrical signal to said modulator means, means for photo detecting said replica at a given location on said screen to provide successive output signals and means for displaying said output signals along a time base corresponding to said variable delay to provide an image of said signal.

18. The system according to claim 17 further comprising lock-in amplifier means operated at said rate synchronously with said signal applying means for applying said output signals to said displaying means, and wherein said displaying means comprises an oscilloscope having an X input and a Y input, means for applying the amplified output signals from said lock-in amplifier means to said Y input and means for applying ramp signals which correspond to said variable delay to said X input to provide said time base.

* * * * *